United States Patent [19]
Yin

[11] Patent Number: 5,701,021
[45] Date of Patent: Dec. 23, 1997

[54] CELL ARCHITECTURE FOR MIXED SIGNAL APPLICATIONS

[75] Inventor: Patrick Yin, Fremont, Calif.

[73] Assignee: Aspec Technology, Inc., Sunnyvale, Calif.

[21] Appl. No.: 574,497

[22] Filed: Dec. 19, 1995

[51] Int. Cl.$^6$ .................. H01L 27/092; H01L 27/118
[52] U.S. Cl. .................. 257/208; 257/203; 257/206; 257/210
[58] Field of Search .................. 257/203, 206, 257/207, 208, 210

[56] References Cited

U.S. PATENT DOCUMENTS

| 5,072,285 | 12/1991 | Ueda et al. | 257/206 |
| 5,298,774 | 3/1994 | Ueda et al. | 257/210 |

FOREIGN PATENT DOCUMENTS

| 5275661 | 10/1993 | Japan | 257/207 |

Primary Examiner—Jerome Jackson
Attorney, Agent, or Firm—Sawyer & Associates

[57] ABSTRACT

A cell architecture for mixed signal applications is disclosed that utilizes significantly less silicon area than the prior art. The core cell includes a transistor arrangement in which substrate taps are located adjacent to the transistor pairs. This provides for a more "symmetric" cell array than those in the prior art. Through the placement of the taps outside of the transistors the power line connections can be routed in a simple and efficient manner. The architecture includes an extension portion in the contact region of the cell to further reduce wiring complexity. In addition the gate array architecture mirrors pairs of transistor columns to allow for the sharing of substrate taps between pairs of columns. This mirroring feature further reduces routing complexity. The cell architecture includes a substrate tap area that allows for the accommodation of a plurality of electrically isolated metal lines.

15 Claims, 3 Drawing Sheets

CELL ARCHITECTURE FOR MIXED SIGNAL APPLICATIONS

FIELD OF THE INVENTION

The present invention relates to a complementary metal-oxide silicon (CMOS) logic cell and more particularly to a CMOS logic cell architecture having a plurality of core cells.

BACKGROUND OF THE INVENTION

Gate arrays are used in VLSI integrated circuit chips to implement MOSFET circuits in semiconductor wafers. An MOS gate array consists of an array of MOS transistor sources and drains separated by channels, above which are formed gates to control the conductivity of the channels and thus the state of the transistors. An array of these gates (and their sources and drains) becomes functional only when connected by conductive wiring to appropriate other elements.

Generally, the connecting is accomplished in two steps: a library of macrocells is available to translate simple frequently used logic functions such as NAND, flip-flop, AND, multiplexer, and counter into a gate array wiring pattern, then the macrocells are connected together to form the complex logic functions of the VLSI chip.

Although conceptually there are two steps, the actual metallization to accomplish the two steps is laid out in as few layers as possible, preferably two, so the metal to implement a single macrocell and the metal to connect macrocells to each other is in the same metallization layers. Therefore if an area in a metal layer is used for connecting points within a macrocell, it is not also available for connecting macrocells to each other.

There has been considerable interest in implementing complex logic operations on smaller areas of semiconductor material, while simultaneously retaining the flexibility provided by a gate array in which identical structural units or core cells repeat throughout a large portion of the semiconductor area. An Application Specific Integrated Circuit (ASIC) is a cell architecture that can be used for gate array or cell based design methodology.

In a gate array implementation, the personality layers reflect the function or functions to be implemented by the finished array. A given base array can be used to implement many different functions by appropriately designing the personality layers. Thus a gate array allows many different logic functions to be implemented using the same base array. The geometry of the base array cell affects the ability of the designer using later metallization to achieve a final product having maximum density and performance.

One prior art layout of a CMOS logic array required dedicated routing channels that are positioned in between pairs of columns of active areas. Typically, each routing channel contains space for a fixed number of leads, i.e. routing tracks, which run on top of oxide isolation regions formed between the pairs of columns. To promote standardization and flexibility in implementing multiple functions within one substrate layout, generally the same number of routing tracks are allocated to each routing channel within the array.

An improvement on this type of prior art array is shown in U.S. Pat. No. 4,884,118 entitled, Double Metal HCMOS Compacted Array, assigned to LSI Logic Corporation. In this embodiment, active areas are arranged in adjacent columns of alternating conductivity types with no intervening area allocated for metal routing. The placement of alternating conductivity type columns allows for the formation of CMOS type devices in which the P-type regions are on either the right or left sides of the devices depending upon the needs of the circuit.

Thus, in a CMOS circuit application, if some chip area must be left unused in order to allow for the most efficient placement of routing channels, less chip area need be wasted in the overall layout since the next CMOS device may begin at the next column of either n-type or p-type, whichever is available.

This prior art method has a high flexibility of circuit design by allowing increments of a single column to be dedicated to routing. This core array design however, has the disadvantage of requiring a symmetrical array, that is, a p channel lying adjacent to an n-channel. This disadvantage manifests itself in several ways. A gate array using the prior art structure described in the above mentioned patent requires at least one contact point that is dedicated to the connection of the substrate taps between the active areas.

In addition to the alternating nature of the active regions, there is a distinct possibility that there has to be extensive routing of the wires in the integrated circuit when providing the personality layer to provide the desired logical structure described in the above-mentioned patent.

The type of logic array described in the above mentioned patent has a core cell of eight transistors which include two substrate taps therebetween. Typically in the prior art cell described in the above mentioned patent, what is shown is an active area with a first pair of p-channel transistors on one side, a second pair of p-channel transistors on a second side and a substrate tap therebetween. This prior art cell includes a second active area with a first pair of n-channel transistors on one side, a second pair of n-channel transistor on a second side and a substrate tap therebetween. The substrate taps provide the P-channel and N-channel substrate with a voltage potential.

The disadvantage of the substrate tap being between p or n channel transistors is gate density (i.e. number of gates per sq.mm). The diffusion spacing between the substrate taps and transistor diffusion is greater than that of the polysilicon. Secondly, the alternating configuration is inefficient at the chip level in random access memory (RAM) or read-only memory (ROM) implementations when the layout is a complex bus structure.

Typically this type of cell is utilized to provide multiple columns of active areas to provide the gate array architecture. This cell has the further disadvantage of requiring the jumping of a column when connections must be made between columns of the same conductivity type. For example in the case when two p-channel and one n-channel are used to form a cell i.e. p-p-n, the p-channel has haft the speed of an n-channels and two p-channel will give a more balanced propagation delay. This adds significant complexity to the routing of these connections. Finally due to the alternating nature of the columns and position of the substrate tap (between the transistors) routing of the voltage potential lines and other metal connections can also become quite complex.

Gate array structures have been disclosed in U.S. Pat. No. 5,404,034 entitled Symmetrical Multi-Layer Logic Array With Continuous Substrate Taps, and U.S. Pat. No. 5,384,472 Symmetrical Multi-Layer Metal Logic Array With Continuous Substrate Taps and Extension Portions For Increased Gate Density, assigned to the assignee of the present application, which provides for a more symmetric design that increases cell density. The symmetric design is accomplished by forming the core cells into columns and mirroring the column of transistor pairs. What is meant by mirroring is that if the first pair of columns comprises a n-channel and a p-channel, the adjoining pair of columns comprises p-channel and n-channel columns in that order. In so doing adjacent columns can share the power supply lines for the substrate taps.

In addition, since all the substrate taps are aligned outside the cells, the number of contact points can be reduced on the active regions by one because there is no need to dedicate one of the contacts (in the second metal layer track) to connecting the corresponding power supply and the substrate taps in the gate array structure. Since the substrate tap is a continuous strip of diffusion at the chip level it also has better electrical characteristics than in the prior art cells.

Although these types of gate array cells are very effective for their intended purpose, there is still a need to improve on such cells. One problem with previously known cells is that it is difficult to prevent, particularly in a densely packed gate array, noise from affecting the operation of the circuits therein. More particularly, when analog and digital circuits are mixed in a particular application, it can affect the performance thereof because the noise from the digital circuits can affect the performance of the analog circuits. Finally, the same problems exist in cell based designs. In the present invention a cell based design means that there are no predefined transistors on the semiconductor substrates. In addition, there are typically no prefabricated master slices as in a gate array or sea of gates. The chip design for a cell based approach typically customizes all the layers because the cell used for the design and routing channel are created during the design process.

Accordingly, what is needed therefore is a system and method for allowing for a densely packed cell to utilize mixed analog and digital circuits and substantially minimize or eliminate these noise problems associated therewith. The present invention addresses such a need.

The present invention overcomes the above-mentioned problems with known gate array cells. In addition, the gate array geometry of the present invention accommodates an optimum circuit layout with minimum waste of silicon area and also accommodates efficient implementation of the personality layers required for the desired logical design.

SUMMARY OF THE INVENTION

A gate array architecture is provided that can be utilized for a semiconductor device that includes analog and digital circuits. This array allows for a more symmetric design than previously known gate array structures. The transistor core cell is accomplished by placing a plurality of tap regions outside of the transistor pairs rather than between them as is shown in the prior art. In addition, the present invention includes an extension portion which is part d a contact point region within an active area of the cell for facilitating routing of power and ground connections and for facilitating connections to other cell regions within the gate array architecture. The present invention further includes at least one tap region in which a plurality of electrically isolated metal lines can be provided. In so doing, the gate array can be used for mixed signal applications, i.e., digital and analog circuitry. Since one basic cell architecture can also be applied to "cell based" design approach, this invention can also be applied likewise.

Finally, through this type of gate array structure, higher useable gate density is expected with additional routing layers than when utilizing previously known gate arrays.

The above-mentioned improvement is obtained due to the increased symmetry of the cell.

DETAILED DESCRIPTION

The present invention relates to an improvement in gate array technology. The following description is presented to enable one of ordinary skill in the art to make and use the invention and is provided in the context of a patent application and its requirements. Various modifications to the preferred embodiment will be readily apparent to those skilled in the art, and the generic principles defined herein may be applied to other embodiments. Thus, the present invention is not intended to be limited to the embodiment shown, but is to be accorded the widest scope consistent with the principles and features described herein.

Figure 1:
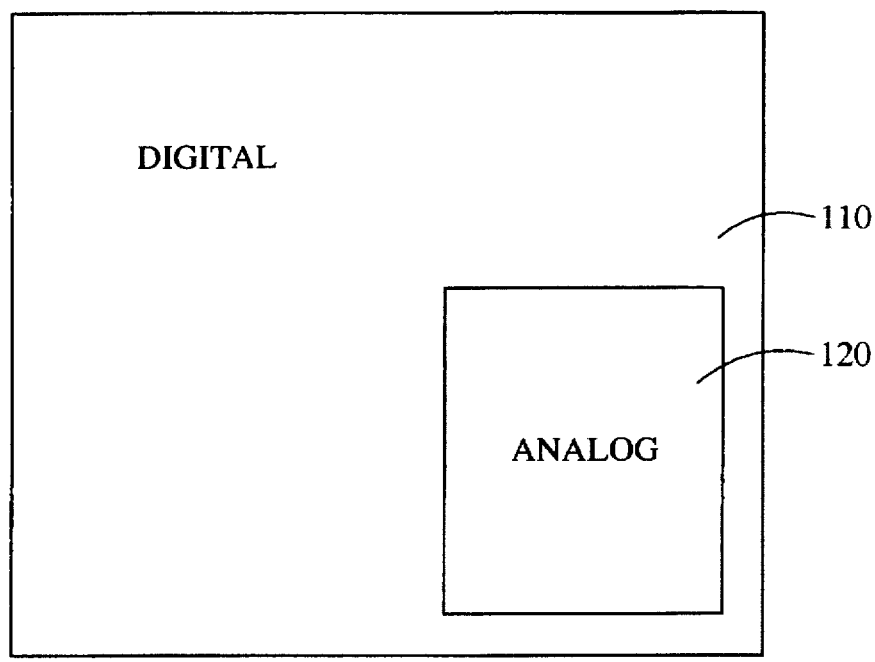
FIG. 1 is a simple block diagram of a gate array cell in which digital circuitry is a major part of the gate array cell and analog circuitry is also associated therewith.

FIG. 1 is a simple block diagram of a gate array cell in which digital circuitry is a major part of the gate array cell 100 and analog circuitry 120 is also associated therewith. As has been before mentioned, the problems associated with densely packed gate array cells in such an environment is that the noise from the digital circuitry can affect the operation of the analog circuitry. The present invention provides a system for minimizing this noise problem.

Figure 2:
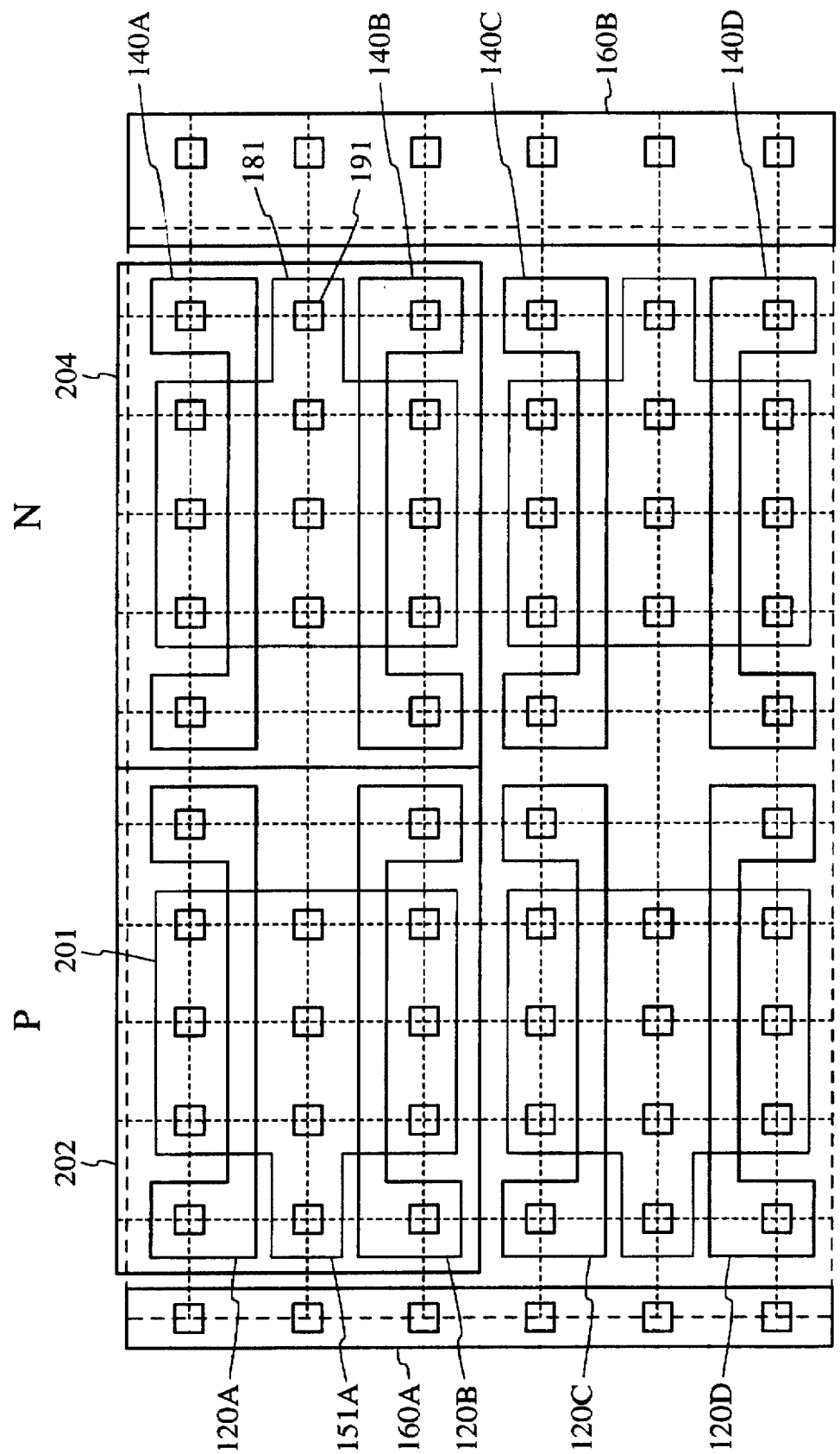
FIG. 2 is a block diagram of a gate array core architecture in accordance with the present invention.

To more particularly describe the problem, refer now to FIG. 2 which shows a gate array core architecture in accordance with the present invention. In this embodiment, the gate array core cell 200 includes a plurality of transistors 120a–d and 140a–d.

In this embodiment, the area bounded by 202 is an active area which comprises p-type transistors 120a–220d. The area bounded by 204 is an active area which comprises n-channel transistors 140a–d. Each of the transistors 120a–d and 140a–d include a source drain and gate region for controlling the flow of current therebetween. The active areas 202 and 204 include a contact point region 201 which in this embodiment is within the plurality of p-type and n-channel transistors respectively. In this embodiment, the substrate taps 160a–b are located adjacent to their associated transistor pair. Since the taps 160a–b are outside of the routing area the power line which connects the substrate taps as well as the source region of the transistor runs on the top of the substrate taps. This core cell 200 includes an extension portion 181 which will facilitate connection via lines 191 directly to the associated ground connection without affecting connections to other regions of the structure.

In this embodiment, the extension portion 181 is part of the contact region 201 and projects outwardly such that the connection to the contact point 191 will not interfere with any other of the connections to active areas 202 and 204 of the cell. The extension portion 181 is substantially adjacent to the end portions of the transistors 120a–d and 140a–d, respectively. This extension portion 181 provides an additional contact point which improves cell routability. In other words, cells can now be designed more efficiently which will in turn lead to an improvement in gate utilization. Hence, as above mentioned, the contact points shown at contact region 201 can be utilized for other purposes.

Through the use of the extension portion 181 a more dense structure is provided since power or ground line connections can be made from the contact point region 201 without affecting the connections within the internal architecture as has been necessary in prior art gate array cells. This core cell 200 has the further advantage of having increased density due to the mirroring arrangement, thereby providing a more efficient architecture than those previously known.

As before mentioned, the substrate tap 160b is extended in such a way to provide a plurality of electrically isolated portions from, in this embodiment, the n-type transistors 140a–d. In so doing, the digital circuitry power supply voltage can be electrically isolated from the analog circuitry power supply voltage associated with mixed signal applications, thereby substantially minimizing noise associated therewith.

Figure 4:
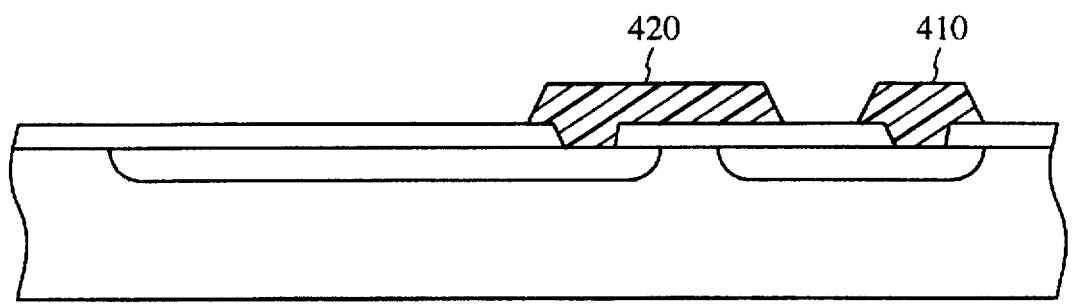
FIG. 4 is a cross section A—A of a portion of the gate array architecture of FIG. 3.
Figure 3:
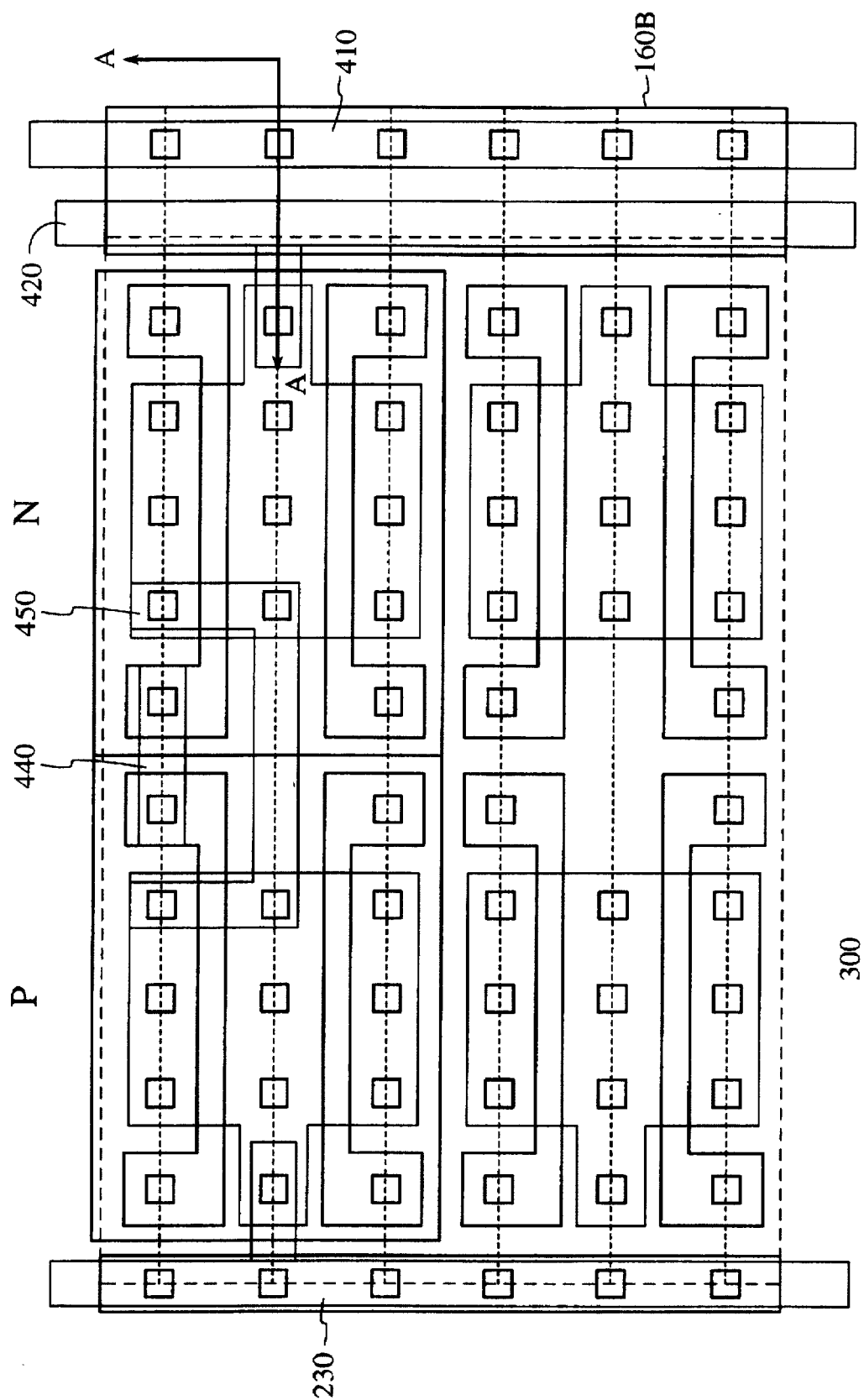
FIG. 3 is a block diagram of the gate array architecture of FIG. 2 with metal lines.

Referring now to FIG. 3, what is shown is the gate array architecture 300 of FIG. 2 with metal lines 230 associated with tap region 160a, metal lines 440 and 450 associated with the active areas and metal lines 410 and 420 associated with tap region 160b. The metal line 420 is utilized for the power supply to the transistors. The metal line 410 is utilized for the power to the substrate tap. Referring now to FIG. 4, what is shown is a cross section A—A of a portion of the gate array architecture of FIG. 3. As is seen the metal line 420 is electrically isolated from the metal line 410. By providing a wide enough substrate tap to accommodate a plurality of electrically isolated metal lines that can provide for power for the digital circuit and substrate tap, switching noise on the power line (ground line in this case), due to switching of logic gates, is not injected into the common substrate on which analog circuits are also fabricated.

Although the present invention has been described in accordance with the embodiment, one of ordinary skill in the art recognizes that there could be variations to the embodiment and those variations would be within the spirit and scope of the present invention. For example even though the present invention has been described in the context of n-type transistors, one of ordinary skilled in the art readily recognizes that p-type transistors could be utilized and that use would be within the spirit and scope of the present invention. Furthermore, this invention can also be applied to a cell based library. Accordingly many modifications may be made by one of ordinary skill in the art without departing from the spirit and scope of the present invention, the scope of which is defined solely by the appended claims.

I claim:

1. An integrated circuit cell structure comprising:

a semiconductor substrate in which are located a plurality of columns of semiconductor material of a first conductivity type and a plurality of columns of semiconductor material of a second conductivity type;

active areas formed within the columns to which can be connected conductive material, thereby forming active regions, each of the active regions including a contact point region, the contact point region including a plurality of contacts for electrical connection thereto; the contact point region including an extension portion substantially adjacent to an end of each of the active areas for allowing for the connection outside the active region to avoid interference with other connections to the structure; and tap regions formed outside the columns, each of the tap regions being associated with one pair of the columns, at least one of the tap regions being capable of accommodating a plurality of electrically isolated metal lines, each of the tap regions being doped with an opposite material than their respective columns thereby allowing current and voltage characteristics of the columns to be controlled.

2. The integrated circuit cell structure of claim 1 in which the cell structure comprises a gate array.

3. An integrated circuit cell structure of claim 1 in which a core cell of the gate array structure comprises:

a first pair of transistors within a column of the first conductivity type;

a second pair of transistors within a column of the second conductivity type; and a substrate tap within one of the tap regions located adjacent to either the first or second pair of transistors.

4. The cell structure of claim 3 in which the tap regions comprises strips of substrate taps that run the length of the column pairs.

5. An integrated circuit cell structure comprising:

a semiconductor substrate in which are located a plurality of columns of semiconductor material of a first conductivity type and a plurality of columns of semiconductor material of a second conductivity type; the substrate having one of the first and second plurality of columns adjacent to each other and mirroring the next pair of columns such that the conductivity of the first of the next pair of columns is the same as the last of the first pair of columns;

active areas formed within the columns to which can be connected conductive material, thereby forming active regions; each of the active regions including a contact point region, the contact point region including an extension portion substantially adjacent to an end of each of the active areas for allowing for the connection outside the active regions to avoid interference with other connections to the structure; and tap regions formed outside said columns, each of the tap regions being associated with one pair of the columns, at least one of the tap regions being capable of accommodating a plurality of electrically isolated metal lines, each of the tap regions having the opposite conductivity as the columns in which they are adjacent to and to which can be connected conductive material, the tap regions being doped with an opposite material than their respective columns thereby allowing current and voltage characteristics of the columns to be controlled;

wherein the active areas and the tap regions adjacent to one of the columns are placed so as to form a plurality of adjacent cells, each cell comprising a first active area with an associated tap region located adjacent thereto and a second active area and wherein pairs of columns are situated to allow common conductivity columns to share tap regions.

6. The cell structure of claim 5 in which the cell structure comprises a gate array.

7. The cell structure of claim 6 in which the extension portion includes a contact.

8. The cell structure of claim 7 in which the contact of the extension portion being substantially adjacent to an end of the active area facilitates connection of the contact to a tap region and to other regions within the structure.

9. An integrated circuit cell structure of claim 6 in which a core cell of the gate array structure comprises:

a first pair of transistors within a column of the first conductivity type, a second pair of transistors within a column of the second conductivity type, and a substrate tap within one of the tap regions located adjacent to either the first or second pair of transistors.

10. The cell structure of claim 6 in which the tap regions comprises strips of substrate taps that run the length of the column pairs.

11. An integrated circuit cell structure comprising:

a semiconductor substrate in which are located a plurality of p-channel semiconductor material and a plurality of columns of n-channel semiconductor material, the substrate having one of the plurality of p-channel columns adjacent to an n-channel column to form a first column pair, the substrate further having the next pair of columns positioned such that the next pair of columns mirror the first column such that the conductivity of the first column of next column pair is the same as the last column of the first column pair;

active areas formed within the columns to which can be connected conductive material, thereby forming active regions, each of the active regions including a contact point region, the contact point region including a plurality of contacts, the contact point region including an extension portion substantially adjacent to an end of each of the active regions for allowing for connection outside the active regions to avoid interference with other connections to the structure; and tap regions formed outside the column pairs, each of the tap regions being associated with one column pair, each of the tap regions having the opposite conductivity as the column it is adjacent to and to which can be connected conductive material, at least one of the tap regions being capable of accommodating a plurality of electrically isolated metal lines, the tap regions further being heavily doped with conductive material of the opposite type than that of the column it is adjacent to thereby allowing current and voltage characteristics of the columns to be controlled, wherein the active areas and tap regions adjacent to one of the columns are placed so as to form a plurality of adjacent cells, each cell comprising a first active area with an associated tap region located adjacent thereto and a second active area and wherein pairs of columns are situated to allow common conductivity columns to share tap regions.

12. The cell structure of claim 11 in which the cell structure comprises a gate array.

13. The cell structure of claim 11 in which the extension portion includes a contact.

14. The cell structure of claim 13 in which the contact on the extension portion being substantially adjacent to an end of the active area facilitates connection of the contact to a tap region.

15. The cell structure of claim 11 in which the tap regions comprise strips of substrate taps that run the length of the column pairs.

* * * * *